(12) United States Patent
Lin

(10) Patent No.: US 6,930,625 B1
(45) Date of Patent: Aug. 16, 2005

(54) MULTI-THREAD PARALLEL PROCESSING SIGMA-DELTA ADC

(75) Inventor: Chia-Liang Lin, Union City, CA (US)

(73) Assignee: Realtek Semiconductor Corp, Hsinchu (TW)

( * ) Notice: Subject to any disclaimer, the term of this patent is extended or adjusted under 35 U.S.C. 154(b) by 0 days.

(21) Appl. No.: 10/860,815

(22) Filed: Jun. 4, 2004

(51) Int. Cl.[7] .............................................. H03M 3/00
(52) U.S. Cl. ...................................... 341/143; 341/155
(58) Field of Search ................................ 341/143, 155, 341/144, 100, 101

(56) References Cited

U.S. PATENT DOCUMENTS

| | | | | | |
|---|---|---|---|---|---|
| 5,345,236 A | * | 9/1994 | Sramek, Jr. | ................. | 341/144 |
| 6,075,820 A | * | 6/2000 | Comino et al. | ............. | 375/245 |
| 6,111,531 A | * | 8/2000 | Farag | .......................... | 341/143 |
| 6,518,905 B2 | * | 2/2003 | Siferd | ......................... | 341/143 |

* cited by examiner

*Primary Examiner*—Peguy JeanPierre
(74) *Attorney, Agent, or Firm*—Daniel J. Bedell; Smith-Hill and Bedell

(57) ABSTRACT

An analog input signal is digitized by first sampling the analog signal to produce a first sequence of analog samples representing successive magnitudes and de-interleaving the first sequence into a set of two or more second sequences. A parallel processing, sigma-delta modulator then processes the set of second sequences to produce a set of two or more third sequences of digital data elements which are then interleaved to produce a fourth sequence of digital data elements. The fourth sequence is then digitally filtered and decimated to produce a fifth sequence of digital data elements representing successive magnitudes of the analog input signal.

20 Claims, 5 Drawing Sheets

MULTI-THREAD PARALLEL PROCESSING SIGMA-DELTA ADC

BACKGROUND OF THE INVENTION

1. Field of the Invention

The invention relates in general to an analog-digital converter (ADC) and in particular to an ADC employing a multi-thread, parallel processing sigma-delta modulator.

2. Description of Related Art

A sigma-delta ADC is able to digitize an analog signal with relatively high resolution using an inexpensive, relatively low resolution ADC. FIG. 1 is a block diagram illustrating an example prior art sigma-delta ADC for producing a digital output sequence $s_k$ representing the time-varying behavior of an analog input signal $V_{IN}$. ADC 1 includes a sample and hold (S/H) circuit 2 for periodically sampling the $V_{IN}$ signal in response to edges of a clock signal CLK1 to produce a sequence $x_n$ of discrete samples of the analog signal. The CLK1 signal frequency is much higher than the analog signal's bandwidth so that $V_{IN}$ is substantially oversampled. A sigma-delta modulator 3 clocked by CLK1 converts the analog sample sequence $x_n$ into a digital data sequence $y_n$ and a decimator 4 filters and decimates sequence $y_n$ to produce the digital output sequence $s_k$.

Within sigma-delta modulator 3, an analog summer 5 offsets $x_n$ by the output of a digital-analog converter (DAC) 6 to supply an analog input to a filter 7 having a discrete transfer function $H(z)$ producing an output analog sequence $z_n$. An ADC 8 having very coarse resolution digitizes the $z_n$ sequence to produce the modulator's output sequence $y_n$, also providing an input to DAC 6 having the same resolution as ADC 8. Within decimator 4, a digital filter 9 produces an output sequence $s_n$ wherein each element is a weighted sum of values of several of the most recent elements of the $y_n$ sequence. A down sampler 10 down samples $s_n$ to produce elements of output sequence $s_k$ at a frequency lower than that of CLK1. Output sequence $s_k$ depicts successive amplitudes of $V_{IN}$ with much higher resolution than that of ADC 8. Thus, sigma-delta ADC 1 is able to employ a relatively low resolution ADC 8 to produce relatively high resolution output data $s_k$.

The quantization error of ADC 8 can affect the resolution of ADC 1. FIG. 2 models the quantization error of coarse ADC 8 as an additive noise $e_n$ within the system wherein the output $y_n$ of sigma-delta modulator 3 is a linear combination of the input and the additive noise as follows:

$$Y(z) = \frac{H(z)}{1+H(z)}X(z) + \frac{1}{1+H(z)}E(z)$$

The transfer function of this modulator seen by input sequence $x_n$ is $$G(z) = \frac{Y(z)}{X(z)}\bigg|_{E(z)=0} = \frac{H(z)}{1+H(z)}.$$

The transfer of this modulator seen by the additive noise $e_n$ is $$F(z) = \frac{Y(z)}{X(z)}\bigg|_{X(z)=0} = \frac{1}{1+H(z)}.$$

Note that since S/H circuit 2 generates input sequence $x_n$ at a sampling rate much higher than the bandwidth of input signal $V_{IN}$, input sequence $x_n$ consists of only relatively low frequency components in this discrete-time system. However, additive noise $e_n$ is "white noise", uniformly distributed over the entire frequency range. Choosing $H(z)$ such that $F(z)$ is a high-pass response decreases the noise at low frequencies but increases it at high frequencies. We can also choose $H(z)$ so that input sequence $x_n$ sees a feed-through, for example by using a first order loop where $$H(z) = \frac{z^{-1}}{1-z^{-1}}.$$

Correspondingly, transfer functions $G(z)$ and $F(z)$ will be.

$G(z)=z^{-1}$, and $F(z)=1-z^{-1}$.

Thus input sequence $x_n$ sees only a delay ($z^{-1}$), while the additive noise sequence $e_n$ sees a first order high-pass response ($1-z^{-1}$). Such a "noise shaping" choice for $H(z)$ reduces the in-band noise, thereby increasing the in-band signal-to-noise ratio. While this choice for $H(z)$ increases the out-of-band noise, digital filter 9 can remove it by employing appropriately adjusted weighting coefficients so that it acts like a low pass filter. Thus, by redistributing quantization error to move most of the additive noise resulting from the ADC's coarse resolution out of the frequency band of the sampled signal, sigma-delta modulator 3 reduces the impact on system resolution of the additive noise produced by its ADC 8.

FIG. 3 depicts a prior art second order sigma-delta ADC 11 including a sample and hold circuit 12 sampling an analog signal $V_{IN}$ at a sampling rate controlled by clock signal CLK1 to produce a sequence of analog samples $x_n$ supplied as input to a second-order, single threaded, sigma-delta modulator 13. Modulator 13, clocked by CLK1, produces an output digital sequence $y_n$ filtered and decimated by a decimator 14, similar to decimator 4 of FIG. 1, to produce the digital output sequence $s_k$. Modulator 13 includes a summer 15 and a filter 16 for offsetting $x_n$ by the output of a DAC 17 and filtering the result to produce an analog sequence $w_n$. A summer 18 offsets $w_n$ by the output of DAC 17 and a filter 19 filters the result to produce an analog sequence $z_n$. A low resolution ADC 20 digitizes $z_n$ to generate an output digital sequence $y_n$, also supplied as input to DAC 17. The governing recursive formulas for the prior art second-order sigma-delta modulator 13 of FIG. 13 are:

$z_n = z_{n-1} + w_{n-1} - y_{n-1}$ $w_n = w_{n-1} + x_n - y_n$

To digitize $V_{IN}$ with high resolution it is necessary either to operate a sigma-delta ADC at a higher sampling frequency or to employ a higher order sigma-delta ADC. Typically, the maximum operating frequency of the components forming aDC's sigma-delta modulator can limit the maximum sampling frequency of the ADC, so it has been necessary to use higher order ADCs to achieve higher resolution. But designers find it difficult to design stable higher order sigma-delta ADCs because the multiple feedback loops are subject to instablity. In practice, the order of filtering rarely exceeds five (5) and is preferably kept under four (4). With the limitation of the order of filtering and limitations imposed by the maximum operating frequency of the components forming a sigma-delta converter, sigma-delta ADCs are rarely used for digitizing signals having a bandwidth higher than a few megahertz. What is needed is sigma-delta converter that can digitize higher bandwidth signals.

BRIEF SUMMARY OF THE INVENTION

The invention relates to a method or apparatus for digitizing an analog signal to produce digital data representing the successive magnitudes of the analog signal. In accordance with the invention, the analog input signal is digitized by first sampling the analog signal to produce a first sequence of analog samples representing successive magnitudes and then de-interleaving the first sequence into a set of j>1 second sequences. Each jth second sequence includes the $j^{th}$ sample of the first sequence and every $j^{th}$ sample thereafter.

A multi-thread, parallel processing, sigma-delta modulator then processes the set of second sequences to produce a set of j third sequences of digital data which are then interleaved to produce a fourth sequence of digital data. The fourth sequence is then digitally filtered and decimated to produce a fifth sequence of digital data elements representing successive magnitudes of the analog input signal.

Since a multi-thread sigma-delta modulator is able to operate at a frequency $1/j^{th}$ of the sampling frequency, a sigma-delta analog-digital ADC implemented in accordance with the invention employ a j-thread sigma delta modulator, where J>1, can operate at a sampling frequency up to j times that of prior art sigma delta ADCs employing only a single thread sigma-delta converter. This enables a sigma-delta ADC implemented in accordance with the invention to digitize higher frequency analog signals than prior art sigma-delta ADCs.

The claims appended to this specification particularly point out and distinctly claim the subject matter of the invention. However those skilled in the art will best understand both the organization and method of operation of what the application(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

The present invention relates to a sigma-delta analog-digital converter (ADC) employing a multi-thread, parallel processing sigma-delta modulator. While the specification describes at least one exemplary embodiment of the invention considered a best mode of practicing the invention, the invention is not limited to the particular example(s) described below or to the manner in which they operate.

Figure 4:
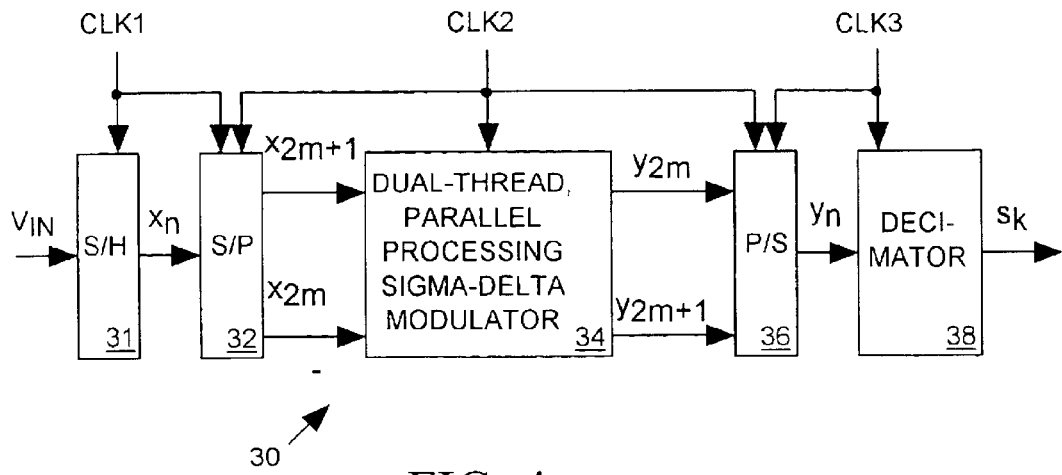
FIG. 4 depicts in block diagram form an example ADC in accordance with the invention.

FIG. 4 depicts an example sigma-delta ADC 30 in accordance with the invention for producing a digital output sequence $s_k$ representing the time-varying behavior of an analog input signal $V_{IN}$. ADC 30 includes a sample and hold (S/H) circuit 31 for periodically sampling input signal $V_{IN}$ in response to edges of a sampling clock signal CLK1 to produce a sequence $x_n$ of discrete analog samples at sampling rate much higher than the bandwidth of $V_{IN}$. A serial/parallel (S/P) converter 32 de-interleaves sample sequence $x_n$ (for n={1, 2, 3, .. }) to form two analog sample sequences $x_{2m+1}$ and $x_{2m}$ such that $x_{2m+1}$ sequence consists of all elements of the $x_n$ sequence for which n is an odd number, and the $x_{2m}$ sequence consists of all elements of the $x_n$ sequence for which n is an even number. Clock signal CLK1 clocks elements of the $x_n$ sequence into S/P converter 32 at the sampling frequency of clock signal CLK1 while a clock signal CLK2 clocks elements of each sequence $x_{2m+1}$ and $x_{2m}$ out of S/P converter 32 at a rate one half of the sampling frequency.

A dual-thread, parallel processing sigma-delta modulator 34, clocked by CLK2, processes the $x_{2m}$ and $x_{2m+1}$ analog sample sequences to produce a pair of digital data sequences $y_{2m}$ and $y_{2m+1}$. A parallel/serial (P/S) converter 36 interleaves digital data elements of the $y_{2m}$ and $y_{2m+1}$ sequences to produce a digital data sequence $y_n$ supplied as input to a decimator 38, suitably similar to decimator 4 of FIG. 1, which filters and decimates $y_n$ to produce digital output sequence $s_k$. Clock signal CLK2 clocks elements of the $y_{2m}$ and $y_{2m+1}$ sequences into P/S converter 36 at one half the CLK1 signal sampling frequency, while a clock signal CLK3 clocks elements of sequence $y_n$ out of P/S converter 36 and into decimator 38 at a rate equal to the sampling frequency.

Figure 1:
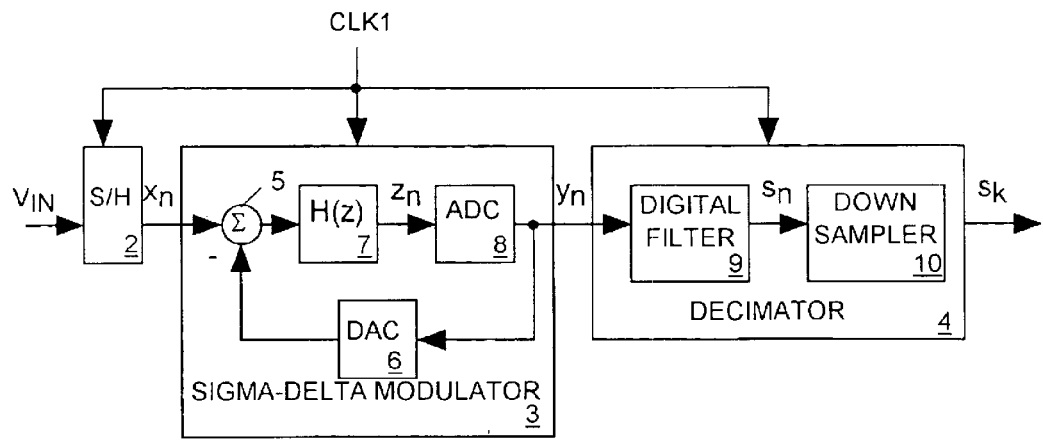
FIG. 1 depicts a prior art first order sigma-delta analog-digital converter (ADC) in block diagram form.
Figure 2:
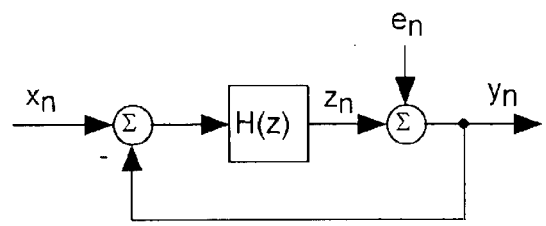
FIG. 2 is a block diagram modeling a transfer function of the sigma-delta modulator of the ADC of FIG. 1.

The maximum frequency of block signal CLK1 at which typical prior art sigma-delta ADC 1 illustrated in FIG. 1 can operate is often limited by the maximum operating frequency of the components forming sigma-delta modulator 1. However, in sigma-delta ADC 30 of FIG. 4, sigma-delta modulator 34 is clocked by clock signal CLK2 at only one half the sampling frequency of CLK1. Thus if sigma-delta modulator 34 of FIG. 4 employs components having the same maximum operating frequency as components within sigma-delta modulator 3 of FIG. 1, sigma-delta ADC 30 can operate at a higher frequency (up to twice of that of sigma-delta ADC 1). This enables sigma-delta ADC 30 to achieve up to twice the resolution of sigma-delta ADC 1 when their sigma-delta modulators 3 and 34 are constructed of components having similar maximum operating frequencies.

The recursive formula governing the conventional first order sigma-delta modulator of FIG. 1 is:

$$z_n = z_{n-1} + x_{n-1} - y_{n-1}$$

The dual-thread parallel processing sigma-delta modulator 34 of FIG. 4 suitably implements the following recursive formulas:

$$z_{2m} = z_{2m-1} + x_{2m-} - y_{2m-1}$$

$$z_{2m+1} = z_{2m} + x_{2m} - y_{2m}$$

Figure 5:
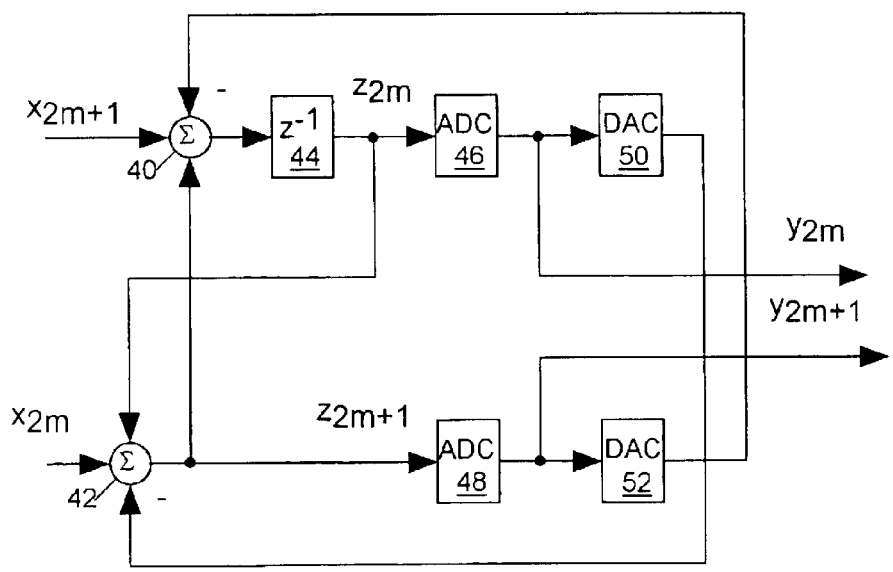
FIG. 5 depicts the first order, double thread, and parallel processing sigma-delta converter of FIG. 4 in more detailed block diagram form.

FIG. 5 illustrates an example implementation of sigma-delta modulator 34 implementing the above recursive formulas. Modulator 34 includes a summing amplifiers 40 and 42, a unit delay ($z^{-1}$) circuit 44, a pair of low-resolution (for example, single-bit) ADCs 46 and 48, and a pair of low-resolution DACs 50 and 52. Summer 40 sums $x_{2m+1}$ with the output of summer 42 and offsets the result by the output of DAC 52 to produce sequence $y_{2m}$. Summer 42 sums $x_{2m}$ with the output of unit delay circuit 44 and offsets the result by the output of DAC 50 to produce sequence $y_{2m+1}$.

The sigma-delta ADC 30 of FIG. 4 in accordance with invention employing the dual-threaded, multiprocessing sigma-delta modulator of FIG. 5 can potentially operate at up two twice the sampling frequency of the conventional sigma-delta ADC 1 of FIG. 1 employing only a single-threaded sigma-delta modular. In practice, the improvement on the sampling frequency will be less than factor of two, due to that the critical path delay in the loop extending from output of delay element 44, through ADC 46, DAC 50, summer 42, ADC 48, DAC 52, summer 40, back to the input of delay element 44. However, as discussed below "look ahead" architecture can shorten the critical path delay when needed to achieve further increases in sampling frequency. Being able to sample at a higher rate enables ADC 30 to digitize higher bandwidth signals and/or to digitize with higher resolution.

Figure 6:
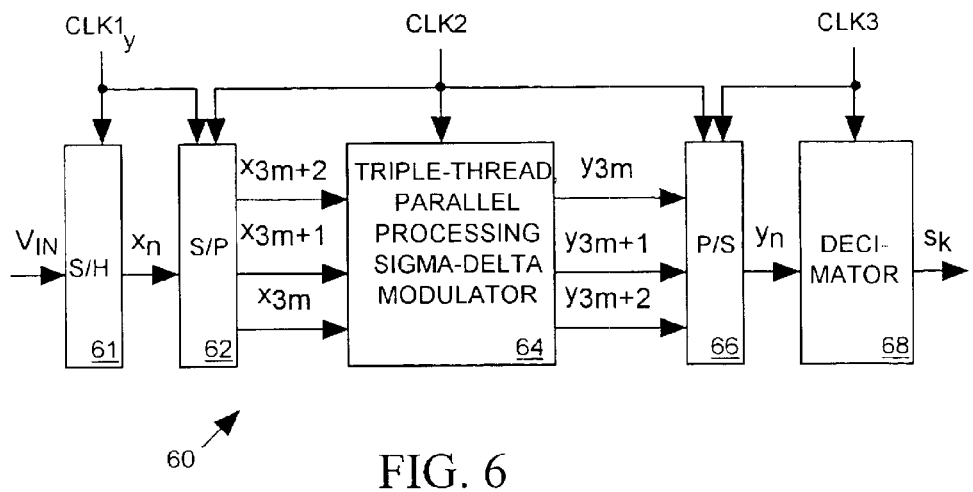
FIG. 6 depicts in block diagram form another example ADC in accordance with the invention.

It is possible to further increase the maximum sampling frequency of a sigma-delta ADC by employing a j-thread parallel processing sigma-delta modulator where j is any number greater than 2. For example, FIG. 6 depicts an example three-thread sigma-delta ADC 60 in accordance with the invention for producing a digital output sequence $s_k$ representing the time-varying behavior of an analog input signal $V_{IN}$. ADC 60 includes a sample and hold (S/H) circuit 61 for periodically sampling input signal $V_{IN}$ in response to edges of a sampling clock signal CLK1 to produce a sequence $x_n$ of discrete analog samples. A serial/parallel (S/P) converter 62 de-interleaves sample sequence $x_n$ into three analog sample sequences $x_{3m+2}$, $x_{3m+1}$ and $x_{3m}$. Sequence $x_{3m}$ includes the first analog sample of sequence $x_n$ and every third analog sample thereafter, sequence $x_{3m+1}$ includes the second analog sample of sequence $x_n$ and every third analog sample thereafter, and sequence $x_{3m+2}$ includes the third analog sample of sequence $x_n$ and every third analog sample thereafter.

Clock signal CLK1 clocks elements of the $x_n$ sequence into S/P converter 62 at the sapling frequency while a clock signal CLK2 clocks elements of each sequence $x_{3m+2}$, $x_{3m+1}$ and $x_{3m}$ out of S/P converter 62 at a rate one third of the sampling frequency.

A three-thread, parallel processing sigma-delta modulator 64, clocked by CLK2, processes the $x_{3m+2}$, $x_{3m+1}$ and $x_{3m}$ sequences to produce a set of three digital data sequences $y_{3m}$, $y_{3m+1}$, and $y_{3m+2}$. A parallel/serial (P/S) converter 66 interleaves elements of the $y_{3m}$, $y_{3m+1}$, and $y_{3m+2}$ sequences to produce a digital sequence $y_n$ supplied as input to a decimator 68, suitably similar to decimator 4 of FIG. 1, which filters and decimates $y_n$ to produce digital output sequence $s_k$. Clock signal CLK2 clocks elements of the $y_{3m}$, $y_{3m+1}$, and $y_{3m+2}$ sequences into P/S converter 66 at one third the CLK1 signal sampling frequency, while a clock signal CLK3 clocks elements of sequence $y_n$ out of P/S converter 66 and into decimator 68 at a rate equal to the sampling frequency.

Figure 3:
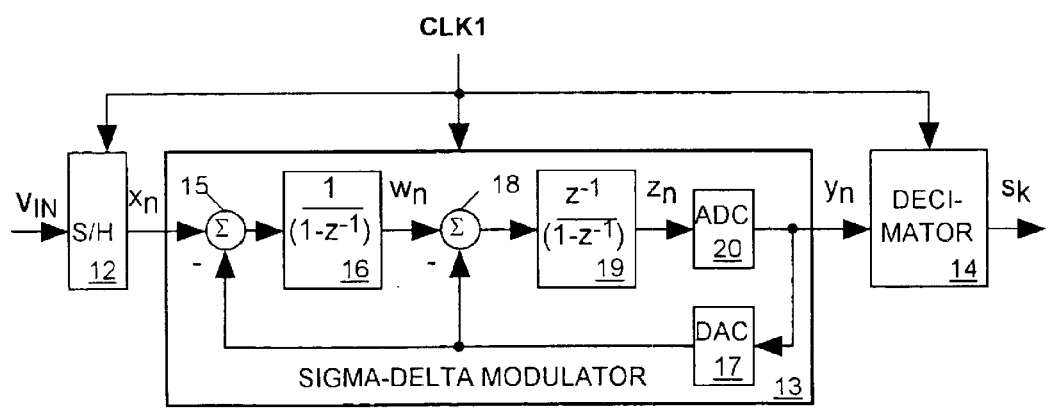
FIG. 3 depicts a prior art second order sigma-delta ADC in block diagram form.

Thus when sigma-delta modulator 64 of FIG. 6 employs components having the same maximum operating frequency as components within sigma-delta modulator 3 of FIG. 3, sigma-delta ADC 60 of FIG. 6 can potential operate at maximum sampling frequency up to triple that of sigma-delta ADC 1 of FIG. 1. This enables sigma-delta ADC 60 to digitize an input signal $V_{IN}$ at up to three times the sampling frequency of sigma-delta ADC 1 when their sigma-delta modulators 3 and 64 are constructed of components having similar maximum operating frequencies. Being able to sample at a higher rate enables ADC 60 to digitize higher bandwidth signals and/or to digitize with higher resolution.

The first order, triple-thread parallel processing sigma delta modulator 64 of FIG. 6 sigma delta modulator suitably implements the following recursive formulas:

$$z_{3m} = z_{3m-1} + x_{3m-1} - y_{3m-1}$$

$$z_{3m+1} = z_{3m} + x_{3m} - y_{3m}$$

$$z_{3m+2} = z_{3m+1} + x_{3m+1} - y_{3m+1}.$$

Figure 7:
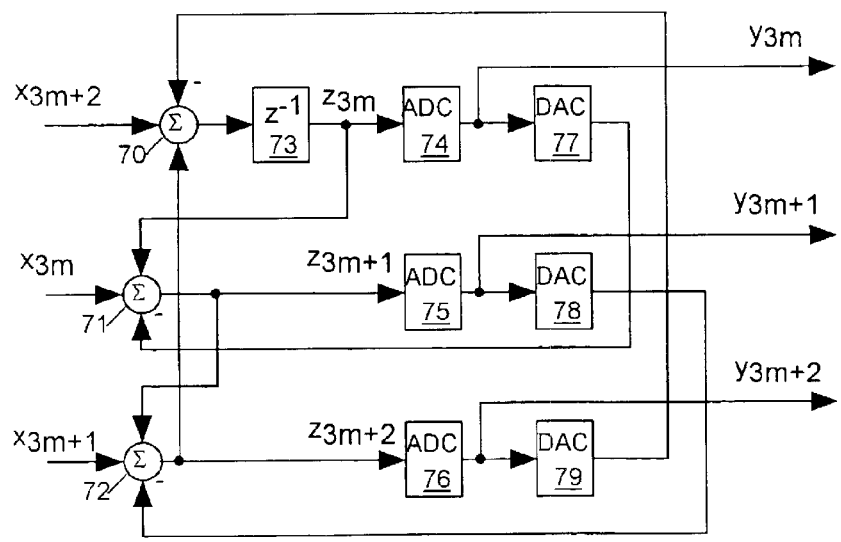
FIG. 7 depicts the first order, triple thread, and parallel processing sigma-delta converter of FIG. 6 in more detailed block diagram form.

FIG. 7 illustrates an example implementation of the three-thread sigma-delta modulator 64 of FIG. 6 including a set of three summing amplifiers 70–72, a unit delay circuit 73, three low resolution ADCs 74–76 and three low resolution DACs 77–79. Summer 70 offsets the sum of $x_{3m+2}$ and $z_{3m+2}$ by the output of DAC 79 and circuit 73 delays the result by one unit delay to produce $z_{3m}$. ADC 74 digitizes $z_{3m}$ to produce $y_{3m}$. Summer 71 offsets the sum of $x_{3m}$ and $z_{3m}$ by the output of DAC 77 to produce $z_{3m+1}$ and ADC 75 digitizes $z_{3m+1}$ to produce $y_{3m+1}$. Summer 72 offsets the sum of $x_{3m+1}$ and $z_{3m+1}$ by the output of DAC 78 to produce $z_{3m+2}$ and ADC 76 digitizes $z_{3m+2}$ to produce $y_{3m+2}$.

Figure 8:
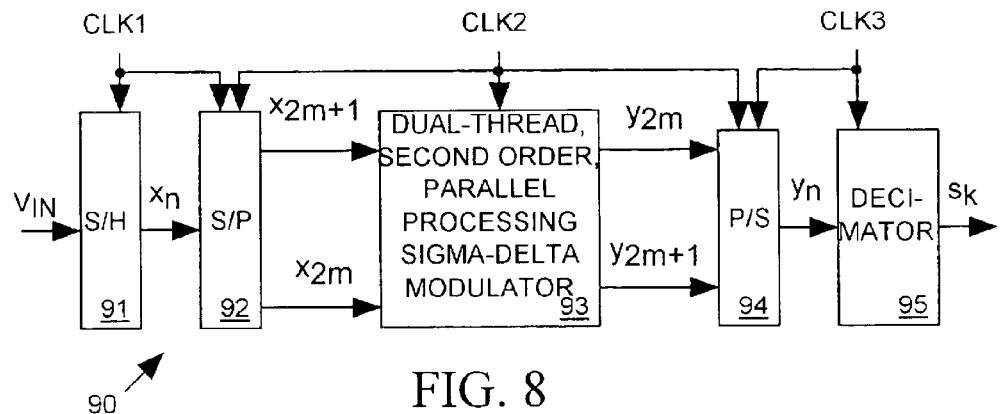
FIG. 8 depicts in block diagram form another example ADC in accordance with the invention.

A sigma-delta ADC in accordance with the invention can be implemented using an $i^{th}$-order, j-thread parallel processing sigma-delta modulator, where i is an integer greater than 0 and j is an integer greater than one. For example, FIG. 8 depicts an example second order, double threaded (i=2, j=2) sigma-delta ADC 90 in accordance with the invention for producing a digital output sequence $s_k$ representing the time-varying behavior of an analog input signal $V_{IN}$. ADC 90 includes a sample and hold (S/H) circuit 91 for periodically sampling input signal $V_{IN}$ in response to edges of a sampling clock signal CLK1 to produce a sequence $x_n$ of discrete analog samples at sampling rate much higher than the bandwidth of $V_{IN}$. A serial/parallel (S/P) converter 92 separate sample sequence $x_n$ into two analog sample sequences $x_{2m+1}$ and $x_{2m}$. Clock signal CLK1 clocks elements of the $x_n$ sequence into S/P converter 92 at the sampling frequency of clock signal CLK1 while a clock signal CLK2 clocks elements of each sequence $x_{2m+1}$ and $x_{2m}$ out of S/P converter 92 at a rate one half of the sampling frequency.

A dual-thread, second order (j=2, i=2), parallel processing sigma-delta modulator 93, clocked by CLK2, processes the $x_{2m}$ and $x_{2m+1}$ sequences to produce a pair of digital data sequences $y_{2m}$ and $y_{2m+1}$. A parallel/serial (P/S) converter 94 interleaves elements of the $y_{2m}$ and $y_{2m+1}$ sequences to produce a digital sequence $y_n$ supplied as input to a decimator 95, for example similar to decimator 4 of FIG. 1, which filters and decimates $y_n$ to produce a digital output sequence $s_k$ representing the time-varying behavior of $V_{IN}$. Clock signal CLK2 clocks elements of the $y_{2m}$ and $y_{2m+1}$ sequences into P/S converter 94 at one half the CLK1 signal sampling frequency, while a clock signal CLK3 clocks elements of sequence $y_n$ out of P/S converter 94 and into decimator 95 at a rate equal to the sampling frequency.

The governing recursive formulas for the prior art second order sigma-delta modulator 13 of FIG. 3 are:

$$z_n = z_{n-1} + w_{n-1} - y_{n-1}$$

$$w_n = w_{n-1} + x_n - y_n$$

Figure 9:
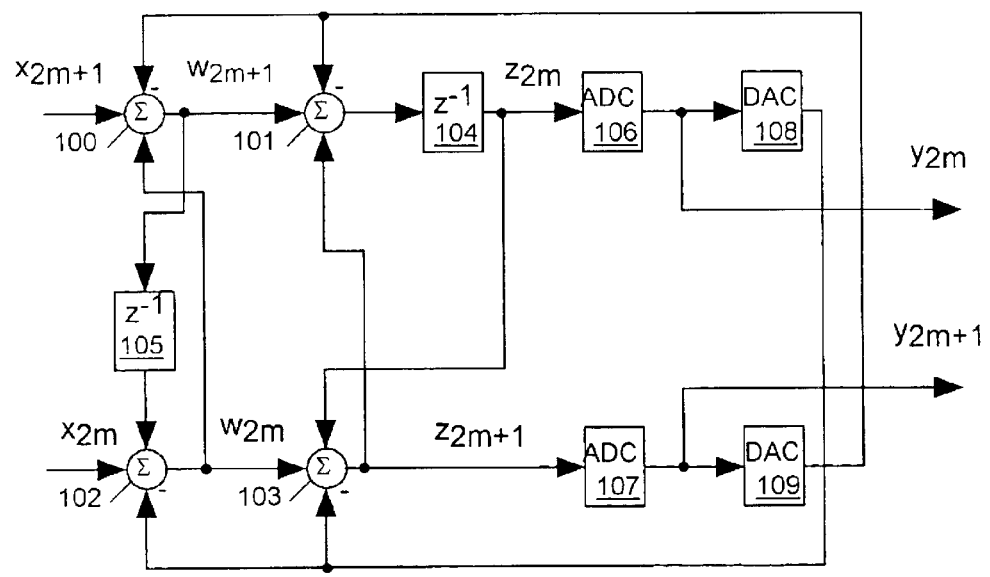
FIG. 9 depicts the second order, double thread, and parallel processing sigma-delta converter of FIG. 8 in more detailed block diagram form.

The dual-thread, second order, parallel processing, sigma-delta modulator 93 of FIG. 9 suitably implements the following recursive formulas:

$$z_{2m} = z_{2m-1} + w_{2m-1} - y_{2m-1}$$

$$w_{2m} = w_{2m-1} + x_{2m} - y_{2m}$$

$$z_{2m+1} = z_{2m} + w_{2m} - y_{2m}$$

$$w_{2m+1} = w_{2m} + x_{2m+1} - y_{2m+1}$$

Modulator 93 includes a set of four summers 100–103, two unit delay circuits 104 and 105, two low resolution ADCs 106 and 107 and two low-resolution DACs 108 and 109. Summer 100 offset the sum of $x_{2m+1}$ and the output $w_{2m}$ of summer 102 by the output of DAC 109 to produce an analog sequence $w_{2m+1}$. Summer 101 offsets the sum of $w_{2m+1}$ and the output $z_{2m+1}$ of summer 103 by the output of DAC 109, and delay circuit 104 delays the output of summer 101 to produce a sequence $z_{2m}$. ADC 106 digitizes the analog sequence $z_{2m}$ to produce an output sequence $y_{2m}$ also supplied as input to DAC 108. Delay circuit 105 delays $w_{2m+1}$ and summer 102 sums the result with $x_{2m}$ and offset the result by the output of DAC 108 to produce an analog sequence $w_{2m}$. Summer 103 offsets the sum of $w_{2m}$ and $z_{2m}$ by the output of DAC 108 to produce the analog sequence e $z_{2m+1}$. ADC 107 digitizes sequence $z_{2m+1}$ to produce an output sequence $y_{2m+1}$ also supplied as input to DAC 109.

The maximum frequency of sampling clock signal CLK1 of the prior art second order sigma-delta ADC 11 illustrated in FIG. 3 is typically limited by the maximum operating frequency of the components forming sigma-delta modulator 13. However, in the second order, sigma-delta ADC 90 of FIG. 8, sigma-delta modulator 93 is locked by clock signal CLK2 at only one half the sampling frequency of CLK1. Thus is sigma-delta modulator 93 employs components having the same maximum operating frequency as components within prior art second order sigma-delta modulator 13 of FIG. 3, sigma-delta ADC 90 can have a higher maximum sampling frequency than sigma-delta ADC 11. Being able to sample at a higher rate enables ADC 90 to digitize higher bandwidth input signals and/or to digitize with higher resolution.

FIG. 9 depicts an example dual-thread (j=2), second order (i=2), parallel processing sigma-delta modulator, but it is possible to construct sigma-delta modulators for other values of j and i. To do so it is necessary to outline the recursive relations for an $i^{th}$-order, j-threaded sigma-delta modulator having a single input $x_n$, a single output $y_n$, and i internal data sequences. Given the recursive equations for a j-threaded, $i^{th}$-order, sigma-delta modulator, one skilled in the art will be able to construct a j-threaded, $i^{th}$-order, sigma-delta modulator.

Those skilled in the art known how to create a set of i equations describing the i internal sequences of an $i^{th}$-order, single-threaded, sigma-delta modulator. For example as described above, in a first order (i=1) system, $z_n$ is the single internal data sequence; in a second order (i=2) system, $z_n$ and $w_n$ are the internal data sequences. To characterize an $i^{th}$-order, j-threaded sigma-delta modulator, we first write down the equation for each intermediate data sequence of an $i^{th}$-order, single-threaded, sigma-delta modulator. To characterize an $i^{th}$-order, j-threaded sigma-delta modulator we provide j recursive equations governing each of the i internal data sequences. Thus given each of the i equations for an $i^{th}$-order, single-threaded, sigma-delta modulator, we convert each equation into a set of j equations by replacing the subscript n with j*m, j*m+1, J*m+2, . . . j*m+(j−1), respectively. In doing so we obtain a set of i*j equations suitable for guiding one skilled in the art in constructing a j-threaded, $i^{th}$-order, sigma-delta modulator.

The example embodiments of the invention described above include ADCs employing first and second order, two and three thread, parallel-processing sigma-delta converters. However, those of skill in the art will appreciate that the principles of the invention described herein can be extended to provide ADCs employing parallel processing sigma-delta converters having more than three threads in connection with higher than second order filtering.

As mentioned above, the critical path delay within a sigma-delta modulator can limit its operating frequency, but the use of "look-ahead" architecture can reduce the critical path delay, thereby increasing the maximum operating frequency of the sigma-delta modulator.

Figure 10:
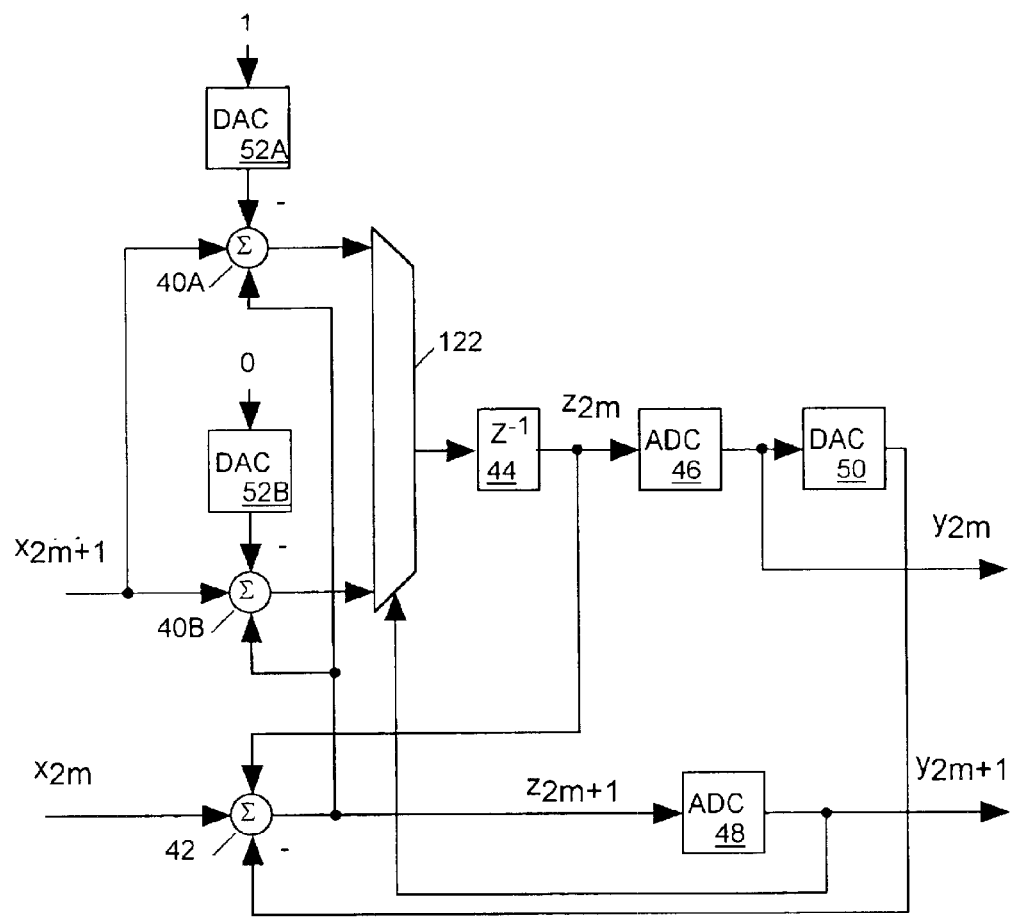
FIG. 10 depicts the first order, double thread parallel processing sigma-delta converter of FIG. 4 with "look ahead" architecture implementation.

FIG. 10 illustrates an example modulator 120, a modified version of modulator 34 of FIG. 5 employing look-ahead architecture to reduce critical path delay. Modulator 120 receives the de-interleaved sequences $x_{2m+1}$ and $x_{2m}$ from serial/parallel converter 32 of FIG. 4, supplies sequence $x_{2m+1}$ as input to a pair of summers 40A and 40B and supplies sequence $x_{2m}$ as input to a summer 42. A DAC 52A converts a hard-wired digital "1" to provide another analog signal at an inverting input of summer 40A and another DAC 52B converts a hard-wired digital "0" to provide an analog signal to an inverting input of summer 40B. The output of summer 42 drives additional inputs of summers 40A and 40B. A multiplexer 122 selects one of the outputs of summers 40A and 40B as input to a unit delay circuit 44. The output $z_{2m}$ of delay circuit 44 supplies an input to summer 42 and to an ADC 46. The output of summer 42 supplies an input $z_{2m+1}$ to an ADC 48. ADCs 46 and 48 produce the modulator's de-interleaved output sequences $y_{2m}$ and $y_{2m+1}$, subsequently interleaved by parallel/serial converter 36 of FIG. 4 to produce the output sequence $y_n$. The output of ADC 48 controls multiplexer 122.

Comparing FIGS. 10 and 5, we see that the outputs of DACs 52A and 52B of FIG. 10 predict the output of DAC 52 of FIG. 5 in response to the output of ADC 48. So that when the output of ADC 48 has settled to steady state, that output can select the output of the particular one of summers 40A or 40B that is correct. Since DAC 52 and summer 40 of FIG. 5 cannot process the output of ADC 48 until it has settled to steady state, their delays add to the critical path delay of modulator 34. Since DACs 52A and 52B and summers 40A and 40B of FIG. 10 operate concurrently with ADC 48, their delays do not add to the critical path delay of modulator 120 except to the extent they may exceed the delay of ADC 48. Although multiplexer 122 adds a small amount to the critical path delay of modulator 120, the total critical path delay of modulator 120 will be much less than that of modulator 34, and modulator 120 will be able to operate at a higher frequency.

The foregoing specification and the drawings depict exemplary embodiments of the best mode(s) of practicing the invention, and elements or steps of the depicted best mode(s) exemplify the elements or steps of the invention as recited in the appended claims. However, the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

What is claimed is:

1. A method for digitizing an analog input signal comprising:
   sampling the analog signal to produce a first sequence of analog samples representing successive magnitudes of the analog signal,
   de-interleaving the first sequence into a set of j second sequences, where j is an integer greater than 1,
   processing the set of j second sequences to produce a set of j third sequences of digital data elements,
   interleaving digital data elements of the set of j third sequences to generate a fourth sequence of digital data elements, and
   digitally filtering and decimating the fourth sequence to produce a fifth sequence of digital data elements representing successive magnitudes of the analog input signal
   wherein the step of processing the set of j second sequences to produce the set of j third sequences of digital data elements comprises the steps of:
   processing an element of at least one of the j second sequences to produce a plurality of alternative element values,
   selecting one alternative element value from among the alternative element values in response to a value of a last produced digital data element of one of the third sequences,
   producing a next digital data element of another of the third sequences as a function of the selected one alternative element value.

2. The method in accordance with claim 1 wherein the first sequence has a first frequency, the third sequence has a second frequency, and said first frequency is higher than said the second frequency.

3. The method in accordance with claim 1 wherein each $j^{th}$ second sequence includes the $j^{th}$ analog sample of the first sequence and every $j^{th}$ analog sample thereafter.

4. The method in accordance with claim 3 wherein the step of processing the set of j second sequences to produce a set of j third sequences of digital data elements is carried out by an $i^{th}$-order, j-thread, parallel processing, sigma-delta modulator, where j is an integer greater than 0.

5. A method for digitizing an analog input signal comprising:
   sampling the analog signal to produce a first sequence of analog samples representing successive magnitudes of the analog signal;
   de-interleaving the first sequence into a set of j second sequences, where j is an integer greater than 1;
   processing the set of j second sequences to produce a set of j third sequences of digital data elements;
   interleaving digital data elements of the set of j third sequences to generate a fourth sequence of digital data elements, and
   digitally filtering and decimating the fourth sequence to produce a fifth sequence of digital data elements representing successive magnitudes of the analog input signal,
   wherein the step of processing the set of j second sequences to produce a set of j third sequences of digital data elements is carried out by an $i^{th}$-order, j-thread, parallel processing, sigma-delta modulator, where i is an integer greater than 0,
   wherein j=2, and i=1,
   wherein the j second sequences comprise a sequence $x_{2m}$ and a sequence $x_{2m+1}$,
   wherein the j third sequences comprise a sequence $y_{2m}$ and a sequence $y_{2m+1}$,
   wherein the step of processing the set of j second sequences to produce the set of j third sequences of digital data elements comprises the steps of:
   digitizing a pair of analog sequences $z_{2m}$ and $z_{2m+1}$ to generate sequences $y_{2m}$ and $y_{2m+1}$, respectively, and
   generating sequences $z_{2m}$ and $z_{2m+1}$ in accordance with the following recursive formulas:

$$z_{2m} = z_{2m-1} + x_{2m-1} - y_{2m-1}$$

$$z_{2m+1} = z_{2m} + x_{2m} - y_{2m}, \text{ and}$$

wherein sequences $x_{2m-1}$, $y_{2m-1}$, and $z_{2m-1}$ and delayed versions of sequences $x_{2m}$, $y_{2m}$, and $z_{2m}$, respectively.

6. A method for digitizing an analog input signal comprising:
   sampling the analog signal to produce a first sequence of analog samples representing successive magnitudes of the analog signal;
   de-interleaving the first sequence into a set of j second sequences, where j is an integer greater than 1;
   processing the set of j second sequences to produce a set of j third sequences of digital data elements;
   interleaving digital data elements of the set of j third sequences to generate a forth sequence of digital data elements; and
   digitally filtering and decimating the fourth sequence to produce a fifth sequence of digital data elements representing successive magnitudes of the analog input signal, wherein the step of processing the set of j second sequences to produce a set of j third sequences of digital data elements is carried out by an $i^{th}$-order, j-thread, parallel processing, sigma-delta modulator, where i is an integer greater than 0.
   wherein j=3, and i=1,
   wherein the j second sequences comprise sequences $x_{3m}$, $x_{3m+1}$, and $x_{3m+2}$,
   wherein the j third sequences comprise sequences $y_{3m}$, $y_{3m+1}$, and $y_{3m+2}$,
   wherein the step of processing the set of j second sequences to produce the set of j third sequences of digital data elements comprises the steps of:
   digitizing each of a set of analog sequences $z_{3m}$, $z_{3m+1}$, and $z_{3m+2}$ to generate sequences $y_{3m}$, $y_{3m+1}$, and $y_{3m+2}$, respectively, and
   generating analog sequences $z_{3m}$, $z_{3m+1}$, and $z_{3m+2}$ in accordance with the following recursive formulas:

$$z_{3m} = z_{3m-1} + x_{3m-1} - y_{3m-1}$$

$$z_{3m+1} = z_{3m} + x_{3m} - y_{3m}$$

$$z_{3m+2} = z_{3m+1} + x_{3m+1} - y_{3m+1}, \text{ and}$$

wherein sequence $z_{3m-1}$, $x_{xm-1}$ and y3m−1 are delayed versions of analog sequences $z_{3m}$, $x_{3m}$ and $y_{3m}$, respectively.

7. A method for digitizing an analog input signal comprising:
   sampling the analog signal to produce a first sequence of analog samples representing successive magnitudes of the analog signal;
   de-interleaving the first sequence into a set of j second sequences, where j is an integer greater than 1;
   processing the set of j second sequences to produce a set of j third sequences of digital data elements;
   interleaving digital data elements of the set of j third sequences to generate a fourth sequence of digital data elements; and
   digitally filtering and decimating the fourth sequence to produce a fifth sequence of digital data elements representing successive magnitudes of the analog input signal, wherein the step of processing the set of j second sequences to produce a set of j third sequences of digital data elements is carried out by an $i^{th}$-order, j-thread, parallel processing, sigma-delta modulator, where j is an integer greater than 0,
   wherein j=2 and i=2,
   wherein the j second sequence comprise a sequence $y_{2m}$ and a sequence $y_{2m+1}$,
   wherein the j third sequences comprise a sequence $y_{2m}$ and a sequence $y_{2m+1}$,
   wherein the step of processing the set of j second sequences to produce the set of j third sequences of digital data elements comprises the steps of:
      digitizing a pair of analog sequences $z_{2m}$ and $z_{2m+1}$ to generate sequences $y_{2m}$ and $y_{2m+1}$, respectively, and
      generating sequences $z_{2m}$ and $z_{2m+1}$ in accordance with the following recursive formulas:

$z_{2m}=z_{2m-1}+w_{2m-1}-y_{2m-1}$ $w_{2m}=w_{2m\ 1}+x_{2m}-y_{2m}$ $z_{2m+1}=z_{2m}+w_{2m}-y_{2m}$ $w_{2m+1}=w_{2m}+x_{2m+1}-y_{2m+1}$ wherein sequences $z_{2m-1}$, $w_{2m-1}$, and $y_{2m-1}$ are delayed versions of sequences $z_{2m}$, $w_{2m}$, and $y_{2m}$, respectively.

8. An apparatus for digitizing an analog input signal comprising:
   a first circuit for sampling the analog signal to produce a first sequence of analog samples representing successive magnitudes of the analog signal,
   a second circuit for de-interleaving the first sequence into a set of j second sequences, where j is an integer greater than 1, for processing the set of j second sequences to produce a set of j third sequences of digital data elements, and for interleaving digital data elements of the set of j third sequences to generate a fourth sequence of digital data elements, and
   a third circuit for digitally filtering and decimating the fourth sequence to produce a fifth sequence of digital data elements representing successive magnitudes of the analog input signal, wherein the second circuit comprises a parallel processing, sigma-delta modulator, employing look-ahead architecture to reduce at least one internal path delay.

9. The method in accordance with claim 8 wherein each $j^{th}$ second sequence includes the $j^{th}$ analog sample of the first sequence and every $j^{th}$ analog sample thereafter.

10. The apparatus in accordance with claim 9 wherein the second circuit comprises an $i^{th}$-order, j-thread, parallel processing, sigma-delta modulator, where i is an integer greater than 0.

11. The apparatus in accordance with claim 10 wherein i=1.

12. The apparatus in accordance with claim 9 wherein j=2.

13. The apparatus of claim 8 wherein the first sequence has a first frequency, the third sequence has a second frequency, and said first frequency is higher than said the second frequency.

14. An apparatus for digitizing an analog input signal comprising:
   a first circuit for sampling the analog signal to produce a first sequence of analog samples representing successive magnitudes of the analog signal,
   a second circuit for de-interleaving the first sequence into a set of j second sequences, where j is an integer greater than 1, for processing the set of j second sequences to produce a set of j third sequences of digital data elements, and for interleaving digital data elements of the set of j third sequences to generate a fourth sequence of digital data elements, and
   a third circuit for digitally filtering and decimating the fourth sequence to produce a fifth sequence of digital data elements representing successive magnitudes of the analog input signal,
   wherein the second circuit comprises an $i^{th}$-order, j-thread, parallel processing, sigma-delta modulator, where i is an integer greater than 0,
   wherein j=2 and i=1,
   wherein the j second sequences comprise a sequence $x_{2m}$ and a sequence $x_{2m+1}$,
   wherein the j third sequences comprise a sequence $y_{2m}$ and a sequence $y_{2m+1}$,
   wherein the second circuit
      digitizes a pair of analog sequences $z_{2m}$ and $z_{2m+1}$ to generate sequences $y_{2m}$ and $y_{2m+1}$, respectively, and
      generates sequences $z_{2m}$ and $z_{2m+1}$ in accordance with the following recursive formulas:

$z_{2m}=z_{2m-1}+x_{2m-1}-y_{2m-1}$ $z_{2m+1}=z_{2m}+x_{2n}-y_{2m}$, and wherein sequences $x_{2m-1}$, $y_{2m-1}$, and $z_{2m-1}$ are delayed versions of sequences $x_{2m}$, $y_{2m}$, and $z_{2m}$, respectively.

15. An apparatus for digitizing an analog input signal comprising:
   a first circuit for sampling the analog signal to produce a first sequence of analog samples representing successive magnitudes of the analog signal,
   a second circuit for de-interleaving the first sequence into a set of j second sequences, where j is an integer greater than 1, for processing the set of j second sequences to produce a set of j third sequences of digital data elements, and for interleaving digital data elements of the set of j third sequences to generate a fourth sequence of digital data elements, and
   a third circuit for digitally filtering and decimating the fourth sequence to produce a fifth sequence of digital data elements representing successive magnitudes of the analog input signal, wherein the second circuit comprises an $i^{th}$-order, j-third, parallel processing, sigma-delta modulator, where j is an integer greater than 0, wherein j=3 and i=1, wherein the j second sequences comprise sequences $x_{3m}$, $x_{3m+1}$, and $x_{3m+2}$, wherein the j third sequences comprise a set of sequences $y_{3m}$, $y_{3m+1}$, and $y_{3m+2}$, wherein the second circuit digitizes each of a set of analog sequences $z_{3m}$, $z_{3m+1}$, and $z_{3m+2}$ to generate sequences $y_{3m}$, $y_{3m+1}$, and $y_{3m+2}$, respectively and generate analog sequences $z_{3m}$, $z_{3m+1}$, and $z_{3m+2}$ in accordance with the following recursive formulas:

$z_{3m} = z_{3m-1} + x_{3m-} - y_{1m-1}$ $z_{3m+1} = z_{3m} + x_{3m} - y_{3m}$ $z_{3m+2} = z_{3m+1} + x_{3m+1} - y_{3m+1}$, and wherein sequence $z_{3m-1}$, $x_{xm-1}$ and $y_{3m-1}$ are delayed versions of analog sequences $z_{3m}$, $x_{3m}$ and $y_{3m}$, respectively.

16. An apparatus for digitizing an analog input signal comprising:

a first circuit for sampling the analog signal to produce a first sequence of sequences $z_{2m}$, $w_{2m}$, and $y_{2m}$, respectively.

17. A sigma-delta modulator for modulating an input signal comprising:

a first circuit for de-interleaving the input signal into a set of j second sequences, where j is an integer greater than 1;

a second circuit for processing the set of j second sequences to produce a set of j third sequences of digital data elements; and a third circuit for interleaving digital data elements of the set of j third sequences to generate a fourth sequence of digital data elements wherein the second circuit comprises a sigma-delta modulator with look-ahead architecture.

18. The sigma-delta modulator of claim 17 wherein the input signal has a first frequency, the third sequence has a second frequency, and said first frequency is higher than said the second frequency.

19. An apparatus for digitizing an analog input signal in comprising:

a first circuit for sampling the analog signal at a rate controlled by a first clock signal, to produce a first sequence of analog samples representing successive magnitudes of the analog signal and for de-interleaving the first sequence into a set of j analog samples representing successive magnitudes of the analog signal, a second circuit for de-interleaving the first sequence into a set of j second sequences, where j is an integer greater than 1, for processing the set of j second sequences to produce a set of j third sequences of digital data elements, and for interleaving digital data elements of the set of j third sequences to generate a fourth sequence of digital data elements, and a third circuit for digitally filtering and decimating the fourth sequence to produce a fifth sequence of digital data elements representing successive magnitudes of the analog input signal, wherein the second circuit comprises an $i^{th}$-order, j-thread, parallel processing, sigma-delta modulator, where i is an integer greater than 0, wherein j=2 and i=2, wherein the j second sequences comprise a sequence $x_{2m}$ and a sequence $x_{2m+1}$, wherein the j third sequences comprise a sequence $y_{2m}$ and a sequence $y_{2m+1}$, wherein the second circuit digitizes a pair of analog sequences $z_{2m}$ and $z_{2m+1}$ to generate sequences $y_{2m}$ and $y_{2m+1}$, respectively, and generates sequences $z_{2m}$ and $z_{2m+1}$ in accordance with the following recursive formulas:

$z_{2m} = z_{2m-1} + w_{2m-1} - y_{2m-1}$ $w_{2m} = w_{2m-1} + x_{2m} - y_{2m}$ $z_{2m+1} = z_{2m} + w_{2m} - y_{2m}$ $w_{2m+1} = w_{2m} + x_{2m+1} - y_{2m+1}$, and wherein sequences $z_{2m-1}$, $w_{2m-1}$, and $y_{2m-1}$ are delayed versions of second sequences produced at a rate controlled by a single phase, second clock signal, where j is an integer greater than 1;

an $i^{th}$-order, j-thread, parallel processing, sigma-delta modulator clocked only by the second clock signal, for processing the set of j second sequences to produce a set of j third sequences of digital data elements, where i is an integer greater than 0; and a second circuit for receiving and interleaving digital data elements of the set of j third sequences to produce a fourth sequence of digital data elements, and digitally filtering and decimating the fourth sequence to produce a fifth sequence of digital data elements at a rate controlled by a third clock signal, wherein the fifth sequence of digital data elements represents successive magnitudes of the analog input signal.

20. The apparatus in accordance with claim 19 wherein the first clock signal is of a higher frequency than the second and third clock signals, and the second clock signal is of a higher frequency than the third clock signal.

* * * * *

UNITED STATES PATENT AND TRADEMARK OFFICE
CERTIFICATE OF CORRECTION

PATENT NO.    : 6,930,625 B1
DATED         : August 16, 2005
INVENTOR(S)   : Chia-Liang Lin It is certified that error appears in the above-identified patent and that said Letters Patent is hereby corrected as shown below:

Column 11,
Line 22, "j-third" should be deleted and replaced with -- j-thread --;
Line 25, "sequence" should be deleted and replaced with -- sequences -- and "$y_{2m}$" should be deleted and replaced with -- $x_{2m}$ --;
Line 26, "$y_{2m+1}$" should be deleted and replaced with -- $x_{2m+1}$ --.

Column 12,
Line 47, "$z_{2m+1} = z_{2m} + x_{2n} - y_{2m}$" should be deleted and replaced with
-- $z_{2m+1} = z_{2m} + x_{2m} - y_{2m}$ --.

Column 13,
Line 1, "j-third" should be deleted and replaced with -- j-thread --;
Line 2, "where j" should be deleted and replaced with -- where i --.
Line 28, the following text should be inserted after "of"
-- analog samples representing successive magnitudes of the analog signal,
    a second circuit for de-interleaving the first sequence into a set of j second sequences, where j is an integer greater than 1, for processing the set of j second sequences to produce a set of j third sequences of digital data elements, and for interleaivng digital data elements of the set of j third sequences to generate a fourth sequence of digital data elements, and
    a third circuit for digitally filtering and decimating the fourth sequence to produce a fifth sequence of digital elements representing successive magnitudes of the analog input signal,
    wherein the second circuit comprises an $i^{th}$-order, j-thread, parallel processing, sigma-delta modulator, where i is an integer greater than 0,
    wherein j = 2 and i = 2,
    wherein the j second sequences comprise a sequence $x_{2m}$ and a sequence $x_{2m+1}$,
    wherein the j third sequences comprise a sequence $y_{2m}$ and a sequence $y_{2m+1}$,
    wherein the second circuit
        digitizes a pair of analog sequences $z_{2m}$ and $z_{2m+1}$ to generate sequences $y_{2m}$ and $y_{2m+1}$, respectively, and
        generates sequences $z_{2m}$ and $z_{2m+1}$ in accordance with the following recursive formulas:

$$z_{2m} = z_{2m-1} + w_{2m-1} - y_{2m-1}$$
$$w_{2m} = w_{2m-1} + x_{2m} - y_{2m}$$
$$z_{2m+1} = z_{2m} + w_{2m} - y_{2m}$$
$$w_{2m+1} = w_{2m} + x_{2m+1} - y_{2m+1}, \text{ and}$$

wherein sequences $z_{2m-1}$, $w_{2m-1}$, and $y_{2m-1}$ are delayed versions of --.

UNITED STATES PATENT AND TRADEMARK OFFICE
CERTIFICATE OF CORRECTION

PATENT NO. : 6,930,625 B1
DATED : August 16, 2005
INVENTOR(S) : Chia-Liang Lin

It is certified that error appears in the above-identified patent and that said Letters Patent is hereby corrected as shown below:

Column 13 (cont'd),
Line 53, "analog samples representing successive magnitudes of the analog signal,
    a second circuit for de-interleaving the first sequence into a set of j second sequences, where j is an integer greater than 1, for processing the set of j second sequences to produce a set of j third sequences of digital data elements, and for interleaivng digital data elements of the set of j third sequences to generate a fourth sequence of digital data elements, and
    a third circuit for digitally filtering and decimating the fourth sequence to produce a fifth sequence of digital elements representing successive magnitudes of the analog input signal,
    wherein the second circuit comprises an $i^{th}$-order, j-thread, parallel processing, sigma-delta modulator, where i is an integer greater than 0, wherein j = 2 and i = 2,
    wherein the j second sequences comprise a sequence $x_{2m}$ and a sequence $x_{2m+1}$,
    wherein the j third sequences comprise a sequence $y_{2m}$ and a sequence $y_{2m+1}$,
    wherein the second circuit
        digitizes a pair of analog sequences $z_{2m}$ and $z_{2m+1}$ to generate sequences $y_{2m}$ and $y_{2m+1}$, respectively, and
        generates sequences $z_{2m}$ and $z_{2m+1}$ in accordance with the following recursive formulas:

$$z_{2m} = z_{2m-1} + w_{2m-1} - y_{2m-1}$$
$$w_{2m} = w_{2m-1} + x_{2m} - y_{2m}$$
$$z_{2m+1} = z_{2m} + w_{2m} - y_{2m}$$
$$w_{2m+1} = w_{2m} + x_{2m+1} - y_{2m+1}, \text{ and}$$

UNITED STATES PATENT AND TRADEMARK OFFICE
CERTIFICATE OF CORRECTION

PATENT NO. : 6,930,625 B1
DATED : August 16, 2005
INVENTOR(S) : Chia-Liang Lin

It is certified that error appears in the above-identified patent and that said Letters Patent is hereby corrected as shown below:

Column 13 (cont'd),
    wherein sequences $z_{2m-1}$, $w_{2m-1}$, and $y_{2m-1}$ are delayed versions of" should be deleted.

Signed and Sealed this

Twentieth Day of December, 2005

JON W. DUDAS
*Director of the United States Patent and Trademark Office*